(12) United States Patent
Schmeisser

(10) Patent No.: US 6,859,698 B2
(45) Date of Patent: Feb. 22, 2005

(54) DETACHABLE CARTRIDGE UNIT AND AUXILIARY UNIT FOR FUNCTION EXPANSION OF A DATA PROCESSING SYSTEM

(75) Inventor: Gordon Schmeisser, Santa Cruz, CA (US)

(73) Assignee: Snap-On Incorporated, Pleasant Prairie, WI (US)

( * ) Notice: Subject to any disclaimer, the term of this patent is extended or adjusted under 35 U.S.C. 154(b) by 792 days.

(21) Appl. No.: 09/884,928

(22) Filed: Jun. 21, 2001

(65) Prior Publication Data

US 2003/0182485 A1 Sep. 25, 2003

(51) Int. Cl.[7] .......................... G06F 19/00; H05K 5/02; H02G 3/08
(52) U.S. Cl. .......................... 701/33; 701/35; 174/52.1; 361/685; 361/759; 326/30; 326/31
(58) Field of Search .............................. 701/29, 33, 35; 174/52.1; 361/685, 759; 326/30, 31

(56) References Cited

U.S. PATENT DOCUMENTS

| 4,831,560 A | | 5/1989 | Zaleski |
| 4,954,928 A | | 9/1990 | Jullien |
| 5,767,445 A | * | 6/1998 | Wu .............................. 174/52.1 |
| 5,887,145 A | | 3/1999 | Harari et al. ............... 395/282 |

FOREIGN PATENT DOCUMENTS

| EP | 0 271 754 | 6/1988 |
| FR | 2 624 979 | 6/1989 |

* cited by examiner

Primary Examiner—Thomas G. Black
Assistant Examiner—Ronnie Mancho
(74) Attorney, Agent, or Firm—McDermott Will & Emery LLP

(57) ABSTRACT

A detachable cartridge unit and an auxiliary unit combined forms a functional component for a data processing system. The cartridge unit is configured to receive a variety of auxiliary units in order to form different functional components and perform different functions. The circuit board of the cartridge unit contains circuits and components common to each functional component. The auxiliary unit contains components and circuits unique to the function that the auxiliary unit represents. The cartridge unit comprises a circuit board, a housing containing the circuit board, a first connector coupled to the circuit board for connecting to a data processing system, a second connector coupled to the circuit board, and a grip movably connected to the housing with a hinge. The auxiliary unit includes an auxiliary circuit board, an auxiliary connector coupled to the auxiliary circuit board for detachably connecting to the second connector, an auxiliary housing containing the auxiliary circuit board, a guide for guiding the auxiliary connector to connect to the second connector via a predetermined path, and an auxiliary grip movably connected to the auxiliary housing with a hinge.

19 Claims, 8 Drawing Sheets

DETACHABLE CARTRIDGE UNIT AND AUXILIARY UNIT FOR FUNCTION EXPANSION OF A DATA PROCESSING SYSTEM

FIELD OF THE INVENTION

The present invention relates generally to function expansion of a data processing system and, more specifically, to providing a detachable auxiliary unit to a removable cartridge unit of a data processing system.

BACKGROUND OF THE INVENTION

Data processing systems like personal computers use removable add-on cards or cartridges containing circuit boards to add additional software and/or hardware to the data processing system. For example, a computerized automotive service system needs to perform a variety of tests on different models of vehicles. The automotive service system requires additional circuits, drivers, software, interfaces, communication protocols, and parameters for different vehicle models to correctly conduct the tests. When a new test is to be performed or another vehicle model is to be tested, an add-on card or a cartridge corresponding to the previous test is removed and a new one corresponding to the new test is plugged into the computerized automotive service system via a receiving slot or socket to provide necessary hardware or software or both to the system. These removable add-on cards or cartridges provide flexible system architecture to perform different types of functions.

However, the use of add-on cards or cartridges to add additional hardware and/or software poses concerns of cost. There are circuits and components common to every add-on card or cartridge. According to conventional design, these common circuits and components have to be provided on every add-on card or cartridge. As the number of add-on cards or cartridges increases, the cost for these redundant circuits and components increases proportionally. These redundant components can increase the cost of add-on cards or cartridges up to 20%.

SUMMARY OF THE INVENTION

Accordingly, there exists a need to provide flexible hardware architecture for a data processing system to adapt to different purposes of use. There is also a need to add or remove additional hardware or software to and from a data processing system, and at the same time, reduce the cost for using the same.

These and other needs are addressed by the present invention. The present invention provides improved design architecture to supply additional functionality to a data processing system and, at the same time, reduce the cost of using the same. The invention also increases protection to components disposed on the add-on cards or cartridges.

An embodiment of the present invention comprises two portions: a cartridge unit and an auxiliary unit. The cartridge unit and the auxiliary unit together form a functional component of a data processing system. The cartridge unit comprises a circuit board, a housing containing the circuit board, a first connector coupled to the circuit board for connecting to a data processing system, a second connector coupled to the circuit board, and a grip movably connected to the housing with a hinge. The auxiliary unit includes an auxiliary circuit board, an auxiliary connector coupled to the auxiliary circuit board for detachably connecting to the second connector, an auxiliary housing containing the auxiliary circuit board, a guide for guiding the auxiliary connector to connect to the second connector via a predetermined path, and an auxiliary grip movably connected to the auxiliary housing with a set of hinges.

The cartridge unit may be adapted to removably attach to a data processing system, such as a computer or a computerized automotive service system. The cartridge unit is configured to receive a variety of auxiliary units in order to form a variety of functional components to perform different functions. The circuit board of the cartridge unit may contain circuits and components common to each functional component, such as interface circuits, a microprocessor, and other supporting logic and circuits that are common to different functional components. The auxiliary unit may contain components and circuits unique to the function that the functional unit represents, such as supporting logic and circuits as well as memory devices, such as an EPROM (Erasable Programmable Read Only Memory), for storing data and code unique to the function that the auxiliary unit represents.

In operation, an auxiliary unit is connected to the cartridge unit to provide a specific function. When a new function or software is required in the data processing system, the auxiliary unit having the function that is no longer needed is removed from the cartridge unit and a new auxiliary unit corresponding to the new function is attached to the cartridge unit.

According to one embodiment, the auxiliary circuit board is enclosed by the auxiliary housing to avoid electrostatic charge from damaging the components affixed thereon.

Both the auxiliary unit and the cartridge unit may have a grip to assist disengaging the units from the objects to which the units are connected. The grip may be part of a surface cover that has a lip portion extending passing a set of hinges with which the surface cover connects to the housing. The grip, as part of the surface cover, is capable of rotating about the hinges. In operation, when an operator holds the grip and rotates the grip about the hinges, the lip portion contacts the object to which the unit is connected. As a result, the surface cover works as a lever and the contact point works as a fulcrum to assist disengaging the unit from the object.

Various advantages of the present invention will become readily apparent from the following detailed description, simply by way of illustration of the invention and not limitation. As will be realized, the invention is capable of other and different embodiments and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings in which like reference numerals refer to similar elements and in which.

DESCRIPTION OF THE PREFERRED EMBODIMENT

Figure 1:
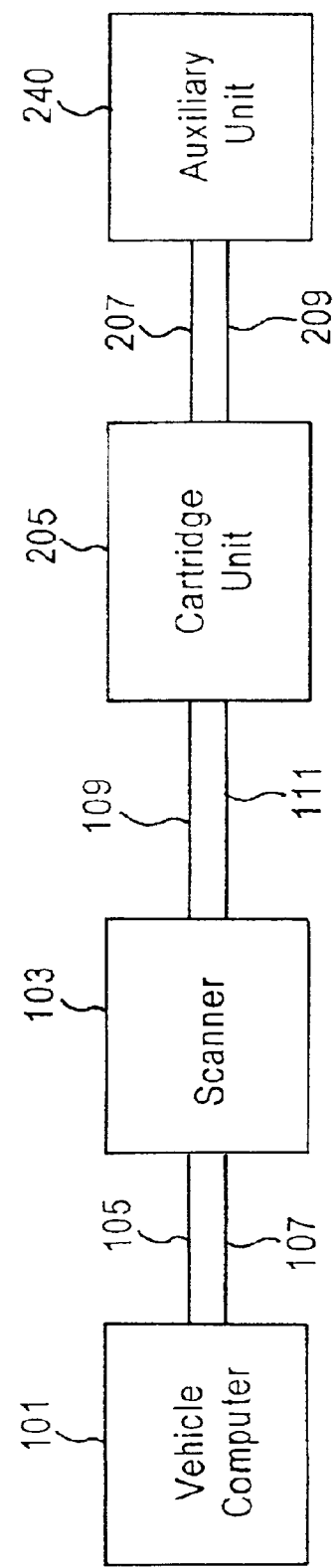
FIG. 1 illustrates a vehicle diagnostic system upon which an embodiment of the invention may be implemented.

FIG. 1 illustrate a vehicle diagnostic system upon which an embodiment of the invention may be implemented. In FIG. 1, a scanner 103 is connected to a vehicle computer 101 and a cartridge unit 205. An auxiliary unit 240 is connected to cartridge unit 205.

Vehicle computer 101 is an on-board data processing system of a vehicle, such as a computer, coupled to a variety of sensors that are used to monitor various vehicle operation parameters. The parameters are useful for determining the operation status of the vehicle. Scanner 103 is a data processing system configured for downloading data or parameters from vehicle computer 101 and may be capable of executing instructions, processing and storing data obtained from vehicle computer 101, and generating control signals to control vehicle computer 101. Scanner 103 may include interface circuits to interface with vehicle computer 101; a processor, such as a embedded controller, for executing instructions and processing signals and data; a memory device, such as ROM or RAM or both for storing, instructions, communication protocols used with different types of vehicle, and/or data obtained from vehicle computer 101.

In operation, scanner 103 connects to an input/output port of vehicle computer 101 to access vehicle parameters stored in vehicle computer 101. The vehicle parameters may include parameters unique to the vehicle, such as model, year, maker, as well as parameters collected by sensors indicating the operation status of the vehicle, such as engine temperature, battery voltage, oil level, brake fluid level, and so on. A data bus 105 and a control bus 107 are provided between scanner 103 and vehicle computer 101 to facilitate transmission of control signals and data therebetween. Control bus 107 and data bus 105 may also share the same physical transmission path by using time multiplexing or coding techniques, such as arranging control signals and data in packets.

Vehicle computer 101, in response to a specific control signal received from scanner 103 via control bus 107, sends operation parameters collected by the sensors to scanner 103 via data bus 103. The operation parameters are then stored in the memory device of scanner 103 and are accessible by the processor of scanner 103.

Scanner 103 has a receiving device, such as a socket, a slot, a connector or the like, for detachably receiving a cartridge unit 205 that has an auxiliary unit 240 coupled thereto. Cartridge unit 205 and auxiliary unit 240 together form a functional component of scanner 103. The circuit board of cartridge unit 205 may contain circuits and components common to each functional component, while auxiliary unit 240 may contain components and circuits unique to the functional component. For example, each auxiliary unit may represent specifications, testing requirements, communication protocols, and/or testing procedures of a specific vehicle model. Cartridge unit 205 communicate with scanner 103 via a data bus 109 and a control bus 111, and with auxiliary unit 240 via a data bus 207 and a control bus 209.

Figure 2:
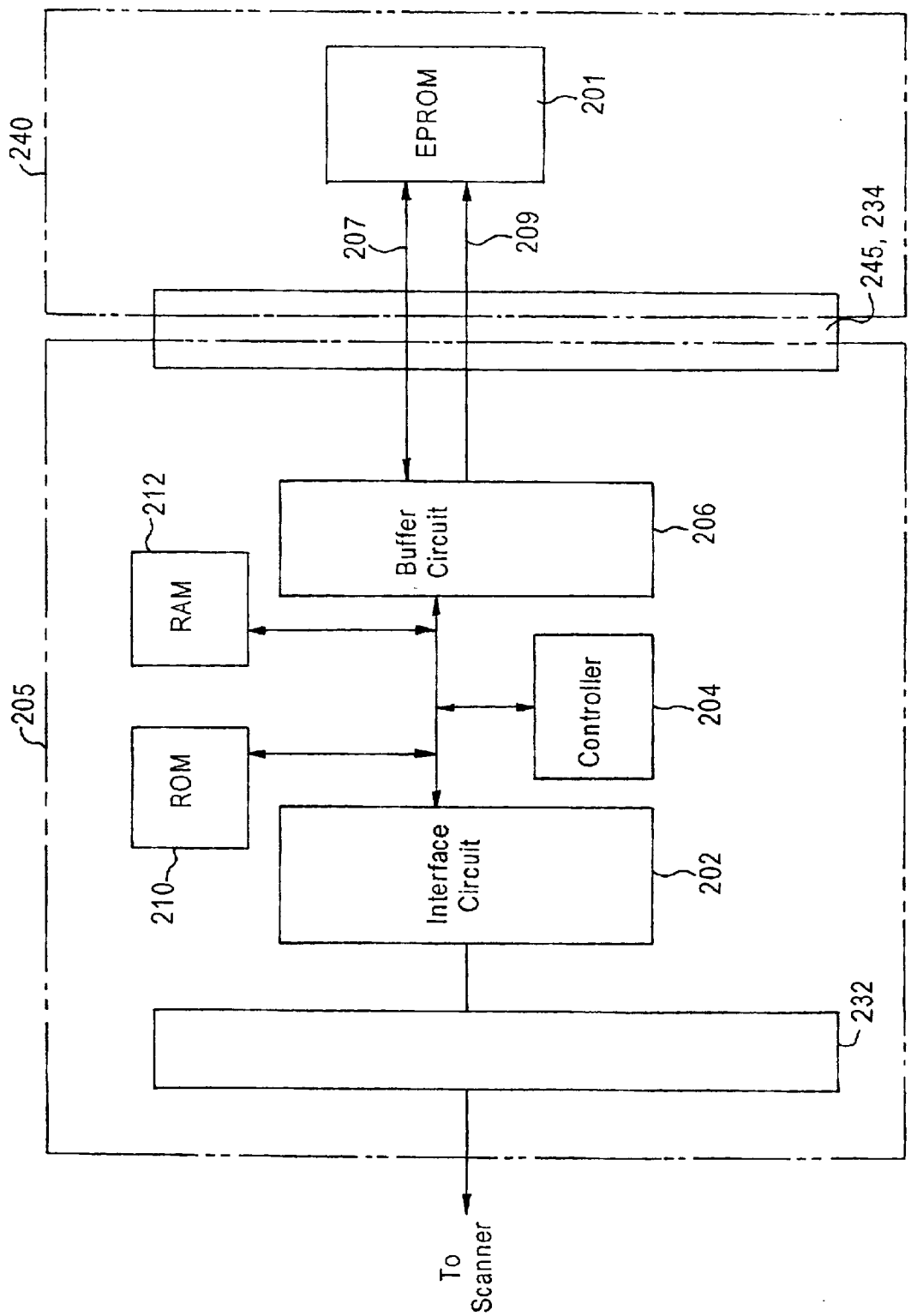
FIG. 2 illustrates a block diagram of a cartridge unit and auxiliary unit implemented according to the present invention.

FIG. 2 illustrates a block diagram of cartridge unit 205 and auxiliary unit 240 implemented according to the present invention. Cartridge unit 205 includes circuits and components common to each functional component, such as a controller 204 coupled to an interface circuit 202, a ROM 210, a RAM 212, a first connector 232, a second connector 234, and a buffer circuit 206. RAM 210 is used for temporally store data or instructions, and is accessible by processor 204. Controller 204 is typically driven by microcode stored in ROM 212. ROM 212 stores static data or instructions or both, as well as communication protocols that are unique to different vehicle models. ROM 212 could be replaced by other types of non-volatile memory such as EEPROM or flash EEPROM.

Auxiliary unit 240 may contain circuits and components unique to each functional component of scanner 103, such as an EPROM 201, an interface and decoding circuit (not shown), and a connector 245. EPROM 201 may store necessary data and software code unique to a specific vehicle model. For example, EPROM 201 may store procedural instructions of conducting diagnostic process for different models of vehicles, and/or communication protocols used in communicating with the vehicle computer of a specific vehicle model. Cartridge unit 205 is configured to receive a variety of auxiliary units in order to form different functional components and perform different functions. Therefore, scanner 103 can be updated by providing new auxiliary units for new vehicle models.

After auxiliary unit 240 connects to cartridge unit 205, connectors 234 and 245 form signal paths between cartridge unit 205 and auxiliary unit 240. A control bus 209 and a data bus 207 are provided to facilitate communication between controller 204 and EPROM 201. Control signals generated by controller 204 are placed on control bus 209 and are decoded by the interface and decoding circuit of auxiliary unit 240. Based on the contents of the control signals, data or instructions or both stored in the EPROM 201 is released to data bus 207 and accessible by controller 204.

As illustrated in FIG. 2, cartridge unit 205 connects to scanner 103 with first connector 232 and receives control signals therefrom. Controller 204 interfaces with scanner 103 via interface circuit 202 and with auxiliary unit 240 via buffer circuit 206.

In operation, auxiliary unit 240 is connected to cartridge unit 205 to provide a specific function to scanner 103. For example, the combination of auxiliary unit 240 and cartridge unit 205 provides communication protocols and test procedures corresponding to a specific vehicle model. By attaching such cartridge unit 205 and auxiliary unit 240 to scanner 103, scanner 103 can properly communicate with vehicle computer 101 of the specific model of vehicle by accessing the specific communication protocol stored in EPROM 201 of auxiliary unit 240. For instance, if a 1997 Ford Taurus is to be tested, auxiliary unit 240 corresponding to 1997 Ford Taurus is located and connected to cartridge unit 205. The units are then attached to scanner 103. Auxiliary unit 240 corresponding to 1997 Ford Taurus stores communication protocols and test procedures that are unique to the vehicle in EPROM 201. Upon connection of cartridge unit 205 and auxiliary unit 240 to scanner 103, scanner 103 gains access to data stored in EPROM 201 by issuing control signals to cartridge unit 205. The control signals may be decoded by controller 204 or other decoding circuits. In response to a control signal requesting access data representing communication protocols, controller 204 may in turn generate control signals to auxiliary unit 240. The control signals may include address data corresponding to the memory location in which the communication protocols are stored.

The control signals are then decoded by the interface and decoding circuit of auxiliary unit 240. Based on the content of the control signals, data corresponding to communication protocol used by the vehicle computer of 1997 Ford Taurus are made available on data bus 207 and in turn on data buses 109, and accessible by scanner 103. With the communication protocol, scanner 103 can properly communicate with the vehicle computer on board of the 1997 Ford Taurus under test. When another vehicle model is to be tested, a corresponding auxiliary unit is attached to cartridge unit 205 to provide proper communication protocols to scanner 103.

Figure 3:
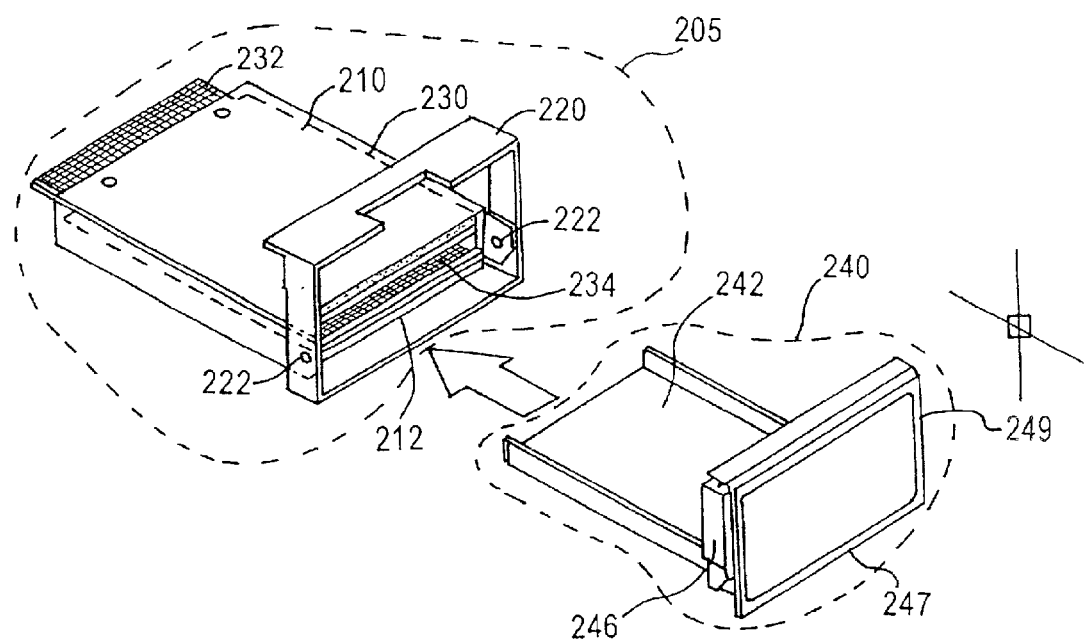
FIG. 3 shows a perspective view of a cartridge unit and an auxiliary unit implemented according to the present invention.

FIG. 3 shows a perspective view of a cartridge unit 205 and auxiliary unit 240 implemented according to the present invention. Cartridge unit 205 has a housing 210 for housing a circuit board 230 on which the components described in FIG. 2 are disposed. A grip 220 is rotatably connected to housing 210 with a set of hinges 222. Circuit board 230 is coupled to a first connector 232 and a second connector 234, and a pathway 212 is formed beneath circuit board 230.

Auxiliary unit 240 has a guide 242 connected to an auxiliary housing 246. Guide 242 may be plate-shaped, substantially U-shaped, L-shaped, or of any other shape that is capable to fit into and travel along pathway 212 disposed in cartridge unit 205. Housing 246 may be disposed vertically on one end of guide 242 and house a circuit board on which EPROM 201 and other circuitry are disposed. A grip 249 is pivotably connected to housing 246.

Housing 210 and 246 protect the components on circuit board from being damaged by electrostatic charge during engagement or disengagement of the auxiliary unit. Electrostatic charge accumulated on a human body may sometimes reach levels of over 1000 volts. The transfer of a static charge from a human body to a circuit board can cause serious damages to the electronic circuitry. During the frequent engagement and disengagement of the auxiliary unit and the cartridge unit, touching of the circuit board by the operator is unavoidable. Having the circuit board contained in the housing shields the circuit board from contacts of the operator and thus prevents the circuit board from being damaged by the electrostatic charge transferred from the human body.

Figure 4:
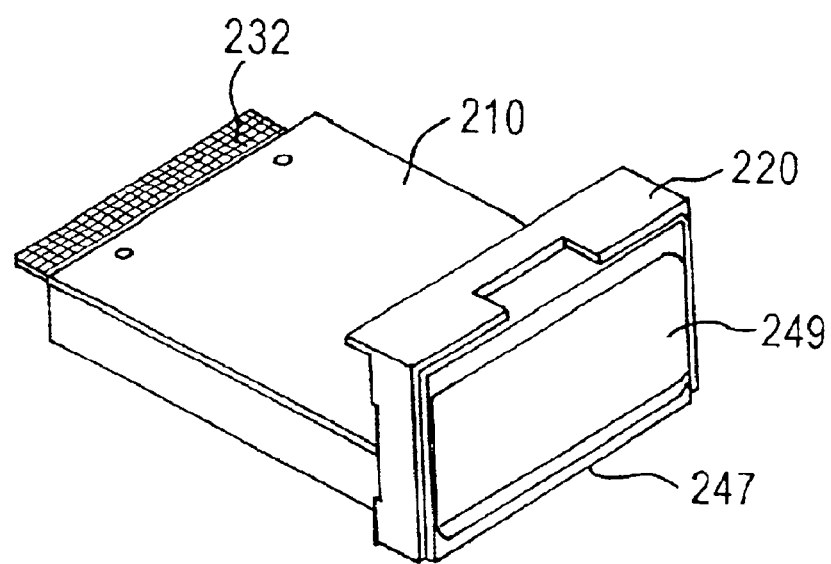
FIG. 4 shows a perspective view of an auxiliary unit together with a cartridge unit after the auxiliary unit is connected to the cartridge unit.

In order to form a functional component of scanner 103, auxiliary unit 240 has to connect to cartridge unit 205. In operation, the tip portion of guide 242 is inserted into matching pathway 212 disposed in cartridge unit 205. By moving auxiliary unit 240 along the direction indicated by the arrow shown in FIG. 3, guide 242 travels along pathway 212 and brings connector 245 to a position close to second connector 234 for connecting to second connector 234. FIG. 4 shows a perspective view of an auxiliary unit together with a cartridge unit after the auxiliary unit is connected to the cartridge unit. In one embodiment, after auxiliary unit 240 is connected to cartridge unit 205, grip 249 and grip 220 form a substantially flat surface.

Figure 5:
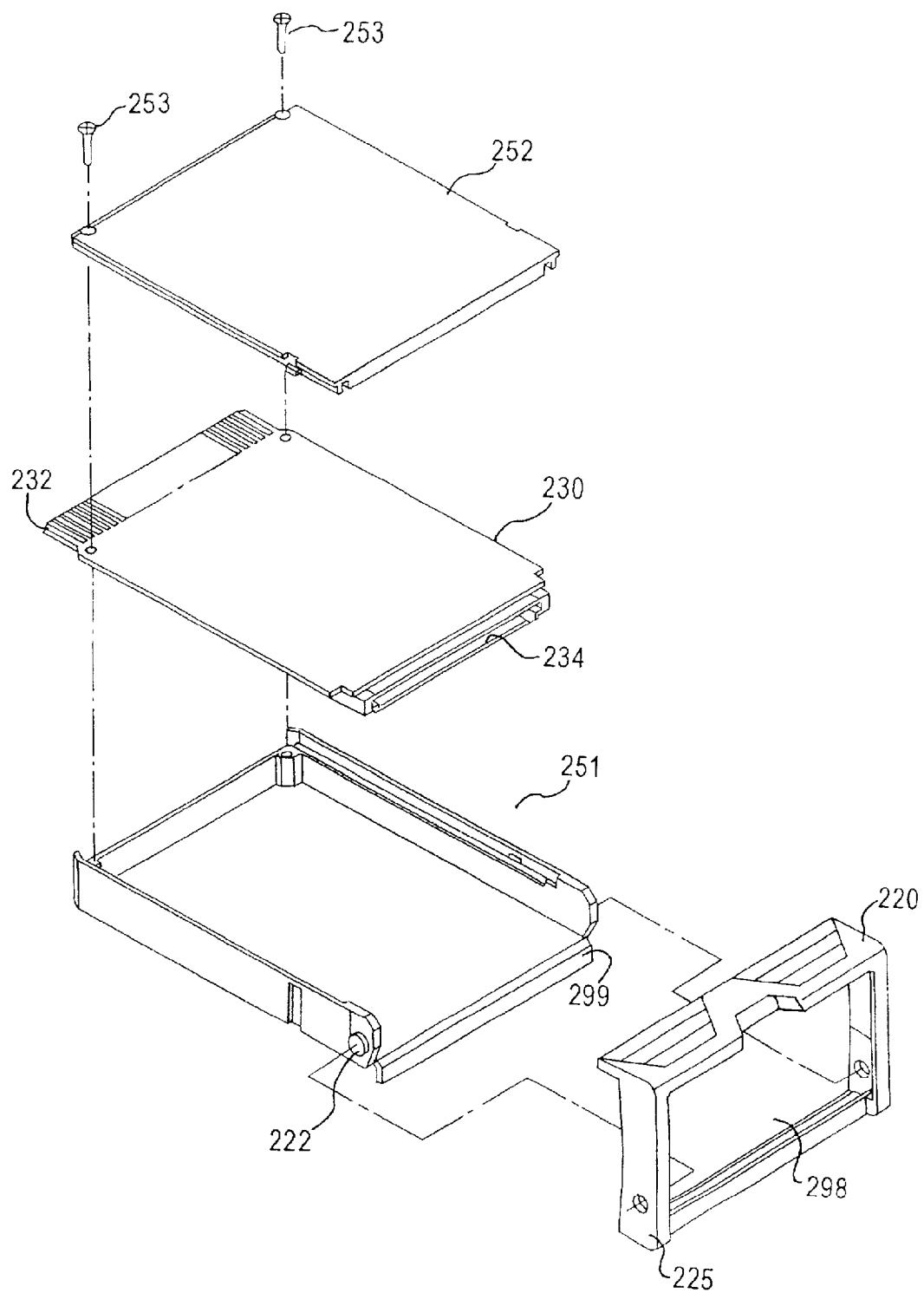
FIG. 5 is an exploded view of a cartridge unit implemented according to the present invention.

FIG. 5 is an exploded view of a cartridge unit implemented according to the present invention. Housing 210 may comprise a cover 252 and a lower portion 251. Cover 252, lower portion 251 and circuit board 230 may be assembled together with a set of screws 253. Lower portion 251 has a tongue portion 299. In one embodiment, circuit board 230 is disposed near the upper portion inside housing 210 so that pathway 212 is formed beneath circuit board 230.

First connector 232 may be provided at one end of circuit board 230 and extend to the exterior of housing 210 for connecting to a data processing system, such as a scanner 103 as described above. First connector 232 may be a connecting device, such as a male connector, female connector, golden fingers or the like, for connecting to a matching connecting device disposed on scanner 103. Second connector 234 may be disposed on the other end of circuit board 230 for receiving a matching connector of auxiliary unit 240. Second connector 234 may be a connecting device, such as a male connector or female connector or golden fingers or the like, for connecting to a matching connecting device.

Grip 220 may pivotably connect to housing 210 with a set of hinges 222. Grip 220 may have a lip portion 225 extends past hinges 222. Grip 220 may have an opening 298 with the size and shape substantially equal to grip 249 of auxiliary unit 240 in order to receive grip 249 upon auxiliary unit 240 connects to cartridge unit 205.

Figure 6:
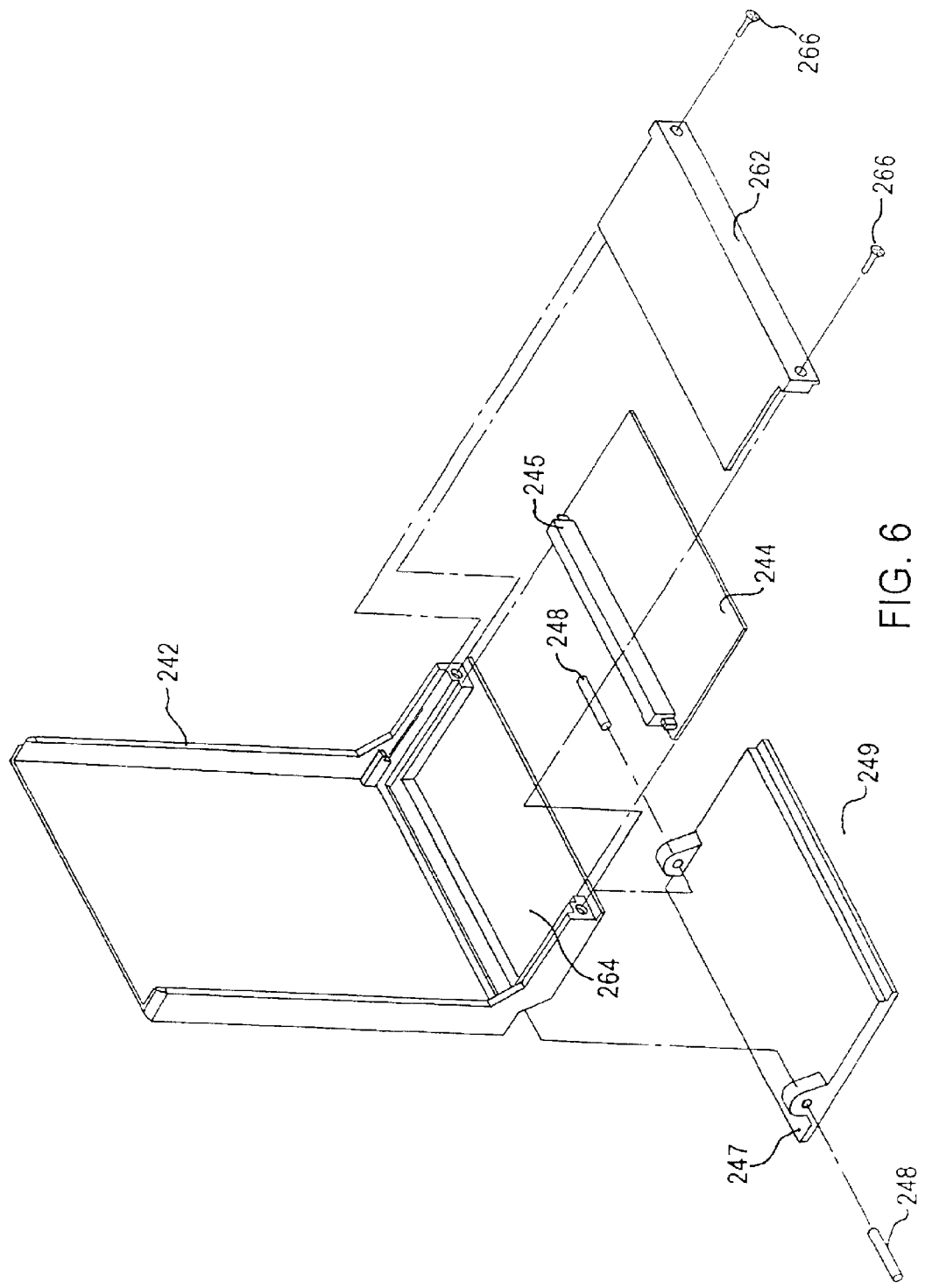
FIG. 6 is an exploded view of an auxiliary unit implemented according to the present invention.

FIG. 6 is an exploded view of an auxiliary unit 240 implemented according to the present invention. A body portion 264 and a cover 262 together form housing 246 and houses circuit board 244. Body portion 264 and cover 262 may be assembled by a set of screws 266. Connector 245 is coupled to circuit board 244 and exposed from housing 246. Grip 249 may be pivotably connected to body portion 264 with a set of hinges 248 and may have a lip portion 247 extending past hinges 248.

Figure 7A:
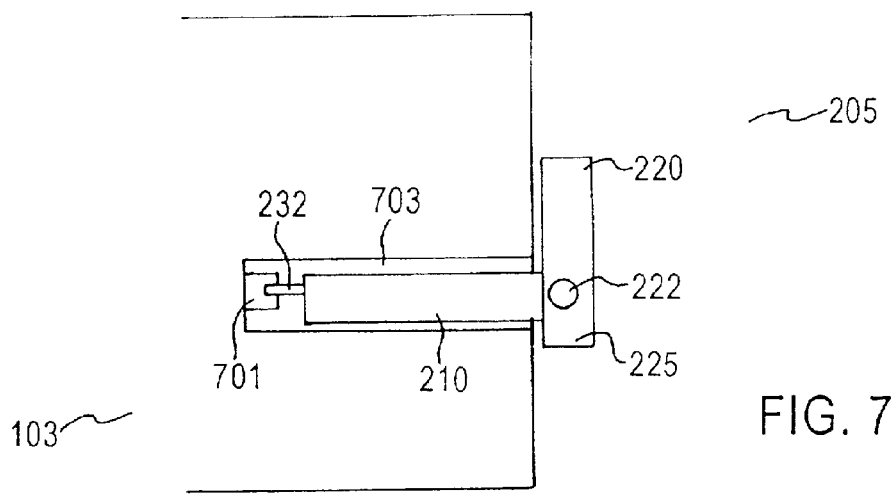
FIGS. 7a, 7b and 7c show how a cartridge unit is detached from a scanner.
Figure 7B:
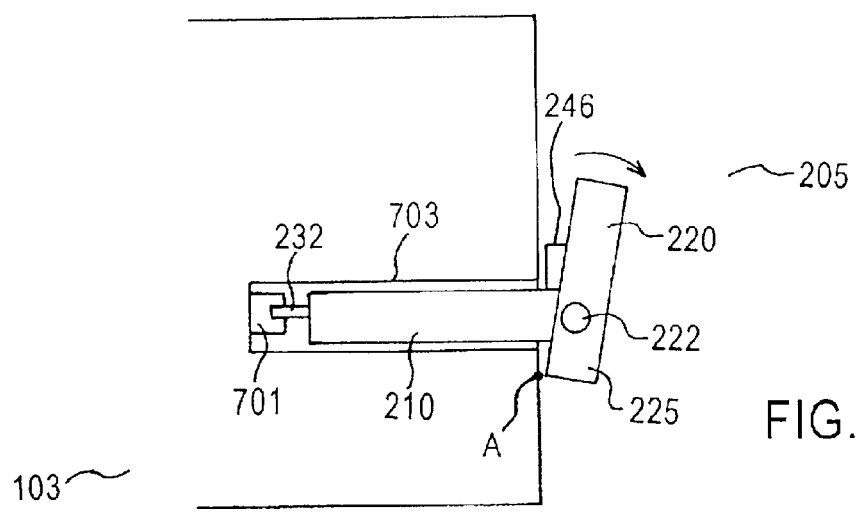
Figure 7C:
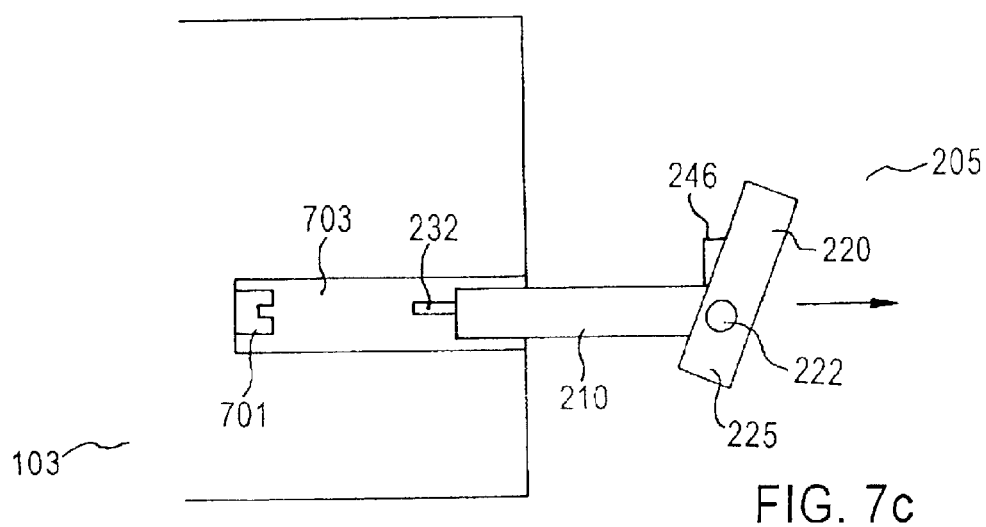

FIGS. 7a, 7b and 7c show how cartridge unit 205 is detached from scanner 103. In FIG. 7a, cartridge unit 205 is inserted into a slot 703 disposed on scanner 103 and connected to a connector 701 with connector 232. Grip 220 has a lip portion 225 extending past hinges 222. FIG. 7b shows the disengagement of cartridge unit 205 from scanner 103. In order to disengage cartridge unit 205 from scanner 103, grip 220 is rotated about hinges 222. After grip 220 is rotated to a certain angle, lip portion 225 contacts a portion of scanner 103 at point A. The combination of the contact at point A and the continued rotation of grip 220 about hinges 222 forms a lever, with fulcrum at point A, load from connectors 232 and 701, and effort from the rotation of grip 220. Therefore, the rotation of grip 220 assists disengagement of connector 232 from connector 701. FIG. 7c shows the removal of cartridge unit 205 from scanner 103 after connector 232 being disengaged from connector 701.

Figure 8A:
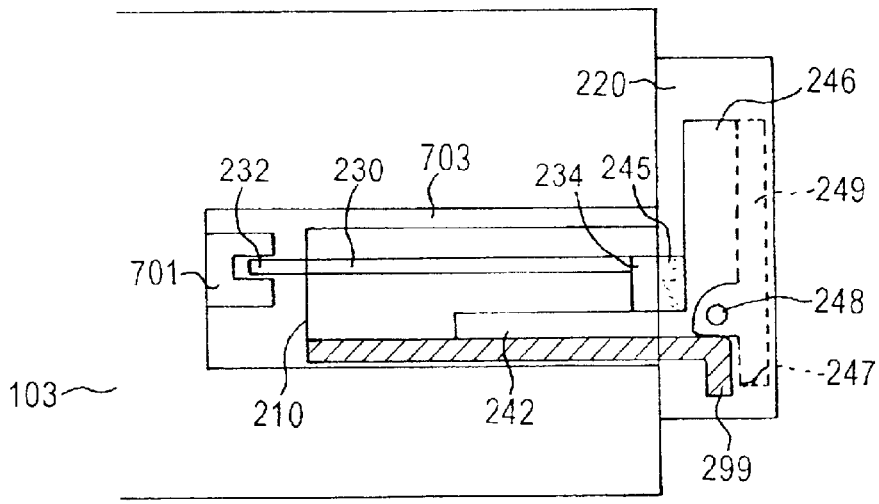
FIGS. 8a, 8b and 8c illustrate how an auxiliary unit is detached from a cartridge unit.
Figure 8B:
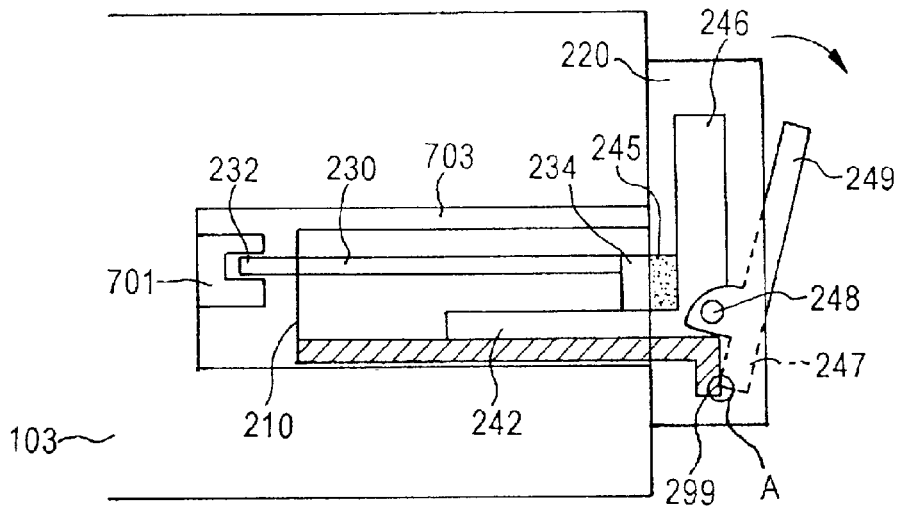
Figure 8C:
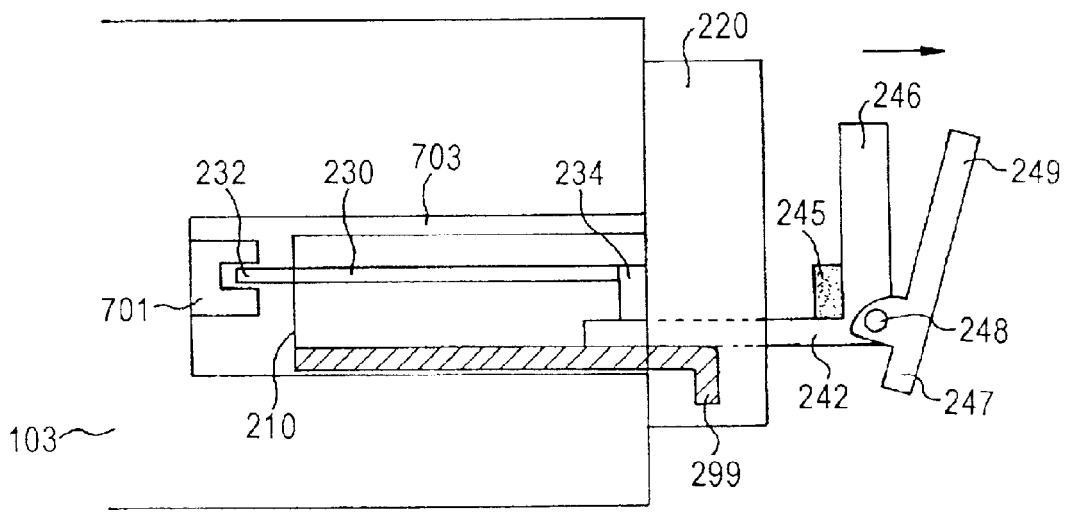

FIGS. 8a, 8b and 8c illustrate how auxiliary unit 240 is detached from cartridge unit 205. For better illustration, FIGS. 8a, 8b and 8c also show scanner 103 to which cartridge unit 205 is attached. In FIG. 8a, auxiliary unit 240 is connected to connector 234 of cartridge unit 205 with connector 245. Grip 249 has a lip portion 247 extending past hinges 248. FIG. 8b shows the disengagement of auxiliary unit 240 from cartridge unit 205. In order to disengage auxiliary unit 240 from cartridge unit 205, auxiliary grip 249 is rotated about hinges 248. After auxiliary grip 249 is rotated to a certain angle, lip portion 247 contacts tongue portion 299 at point A. The combination of the contact at point A and the continued rotation of grip 249 about hinges 248 forms a lever, with fulcrum at point A, load from connectors 234 and 245, and effort from the rotation of grip 249. Therefore, the rotation of grip 249 assists disengagement of connector 245 from connector 234. FIG. 8c shows the removal of auxiliary unit 240 from cartridge unit 205 after connector 245 being disengaged from connector 234.

While this invention has been described in connection with an exemplary embodiment, it is to be understood that the invention is not limited to the disclosed embodiment, but on the contrary, is intended to cover various modifications and equivalent arrangements included within the spirit and scope of the appended claims.

What is claimed is:

1. A vehicle diagnostic system for downloading data from a vehicle computer disposed on a vehicle, comprising:
    a connector for connecting to a data output port of the vehicle computer;
    a processor for processing data;
    a memory device for storing data;
    an interface circuit coupled to the connector for interfacing with the vehicle computer;
    a bus coupled to the processor, the memory device, and the interface circuit; and
    an expansion connector coupled to the bus for detachably receiving a cartridge unit;
    wherein the cartridge unit comprises:
        a circuit board having a controller;
        a housing containing the circuit board;
        a first connector coupled to the circuit board for connecting to the expansion connector;
        a second connector coupled to the circuit board for receiving an auxiliary unit having a memory device; and
        a grip pivotally mounted to the housing;
            wherein the cartridge unit and the auxiliary unit, when connected, form a functional component of the vehicle diagnostic system.

2. The system of claim 1, wherein the grip is mounted to housing with a hinge.

3. The system of claim 1, the grip comprising a lip portion, wherein when the cartridge unit connects to the expansion connector and the grip pivots about the hinge, the lip portion contacts a portion of the vehicle diagnostic system, thereby the contact point between the lip and the vehicle diagnostic system becomes a fulcrum to assist the cartridge unit disengaging from the vehicle diagnostic system.

4. The system of claim 1, wherein the auxiliary unit comprises:
    an auxiliary circuit board;
    an auxiliary memory device disposed on the circuit board;
    an auxiliary connector, coupled to the auxiliary circuit board, for detachably connecting to the second connector of the cartridge unit;
    an auxiliary grip housing containing the auxiliary circuit board and having a guide for guiding the auxiliary connector to connect to the second connector via a predetermined path; and
    an auxiliary grip pivotally mounted to the auxiliary housing;
wherein when the auxiliary unit connects to the cartridge unit, the auxiliary connector and the second connector of the cartridge unit form signal flowing paths.

5. A cartridge unit for use in a data processing system, comprising:
    a circuit board having a controller;
    a housing containing the circuit board;
    a first connector coupled to the circuit board for connecting to the data processing system;
    a second connector coupled to the circuit board;
    a grip pivotally mounted to the housing; and
    an auxiliary unit including:
        an auxiliary circuit board having an auxiliary memory device;
        an auxiliary connector, coupled to the auxiliary circuit board, for detachably connecting to the second connector;
        an auxiliary housing containing the auxiliary circuit board and having a guide for guiding the auxiliary connector to connect to the second connector via a predetermined path; and
        an auxiliary grip pivotally mounted to the auxiliary housing;
        wherein the cartridge unit is configured to receive a variety of auxiliary units, and when the auxiliary unit connects to the cartridge unit, the cartridge unit and the auxiliary unit form a functional component of the data processing system.

6. The cartridge unit of claim 5, wherein the auxiliary grip is mounted to the auxiliary housing with a hinge.

7. The cartridge unit of claim 6, the auxiliary housing comprising a lip portion, wherein when the auxiliary unit connects to the first connector and the auxiliary grip pivots about the hinge, the lip portion contacts a portion of the cartridge unit, thereby the contact point between the lip and cartridge portion becomes a fulcrum to assist the auxiliary unit disengaging from the first connector.

8. The cartridge unit of claim 5, wherein the data processing system is a scanner for downloading data from a vehicle computer, and the auxiliary memory device is an EPROM for storing communication protocols corresponding to the vehicle computer.

9. The cartridge unit of claim 8, wherein data stored in the EPROM is accessible by the controller.

10. An auxiliary unit for detachably connecting to a cartridge unit, comprising:
    an auxiliary circuit board;
    an auxiliary memory device disposed on the circuit board;
    an auxiliary connector, coupled to the auxiliary circuit board, for detachably connecting to a connector of the cartridge unit;
    an auxiliary housing containing the auxiliary circuit board and having a guide for guiding the auxiliary connector to connect to the connector of the cartridge unit via a predetermined path; and
    an auxiliary grip pivotally mounted to the auxiliary housing;
wherein the auxiliary unit and the cartridge unit together form a functional component of a data processing system.

11. The auxiliary unit of claim 10, wherein the auxiliary grip is mounted to the auxiliary housing with a hinge.

12. The auxiliary unit of claim 11, the auxiliary housing comprising a lip portion, wherein when the auxiliary unit connects to the cartridge unit and the auxiliary grip pivots about the hinge, the lip portion contacts a portion of the cartridge unit, thereby the contact point between the lip and cartridge portion becomes a fulcrum to assist the auxiliary unit disengaging from the cartridge unit.

13. The auxiliary unit of claim 10, wherein the data processing system is a scanner for downloading data from a vehicle computer.

14. A cartridge unit for connecting to a data processing system and receiving an auxiliary unit, comprising:

a circuit board having a controller;

a housing containing the circuit board;

a first connector coupled to the circuit board for connecting to the data processing system;

a second connector coupled to the circuit board for receiving the auxiliary unit;

a pathway disposed in the housing for receiving a matching guide of the auxiliary unit; and a grip pivotally mounted to the housing;

wherein the cartridge unit and the auxiliary unit, when connected, form a functional component of the data processing system.

15. The cartridge unit of claim 14, wherein the grip is mounted to the housing with a hinge.

16. The cartridge unit of claim 15, the housing comprising a lip portion, wherein when the cartridge unit connects to the data processing system and the grip pivots about the hinge, the lip portion contacts a portion of the data processing system, thereby the contact point between the lip and data processing system becomes a fulcrum to assist the cartridge unit disengaging from the data processing system.

17. The cartridge unit of claim 14, wherein the data processing system is a scanner for downloading data from a vehicle computer disposed on a vehicle and processing the data to determine the operation status of the vehicle.

18. The cartridge unit of claim 14, wherein the cartridge unit is configured to receive a variety of auxiliary units to form a variety of functional components of the data processing system.

19. The cartridge unit of claim 18, wherein the cartridge unit contains circuitry common to each functional component.

* * * * *